United States Patent
Tapily et al.

(10) Patent No.: US 10,529,830 B2
(45) Date of Patent: Jan. 7, 2020

(54) EXTENSION REGION FOR A SEMICONDUCTOR DEVICE

(71) Applicant: TOKYO ELECTRON LIMITED, Tokyo (JP)

(72) Inventors: Kandabara Tapily, Mechanicville, NY (US); Jeffrey Smith, Clifton Park, NY (US); Nihar Mohanty, Clifton Park, NY (US); Anton J. Devilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/674,012

(22) Filed: Aug. 10, 2017

(65) Prior Publication Data

US 2018/0047832 A1 Feb. 15, 2018

Related U.S. Application Data

(60) Provisional application No. 62/373,164, filed on Aug. 10, 2016.

(51) Int. Cl.
| | |
|---|---|
| *H01L 29/66* | (2006.01) |
| *H01L 29/06* | (2006.01) |
| *H01L 29/10* | (2006.01) |
| *H01L 29/78* | (2006.01) |

(52) U.S. Cl.
CPC .... *H01L 29/66795* (2013.01); *H01L 29/0673* (2013.01); *H01L 29/1054* (2013.01); *H01L 29/66575* (2013.01); *H01L 29/785* (2013.01); *H01L 29/7833* (2013.01)

(58) Field of Classification Search
CPC ..... H01L 29/66545; H01L 2927/13061; H01L 29/0688; H01L 29/0684; H01L 29/068; H01L 29/0676; H01L 29/0673; H01L 29/0669; H01J 2329/0455; H01J 2201/30434
See application file for complete search history.

(56) References Cited

U.S. PATENT DOCUMENTS

| | | | |
|---|---|---|---|
| 8,778,768 B1 * | 7/2014 | Chang | H01L 29/42392 |
| | | | 257/213 |
| 9,362,355 B1 * | 6/2016 | Cheng | H01L 29/66742 |
| 9,570,609 B2 * | 2/2017 | Obradovic | H01L 29/7845 |
| 9,653,289 B1 * | 5/2017 | Balakrishnan | H01L 27/088 |
| 9,831,254 B1 * | 11/2017 | Adusumilli | H01L 27/11206 |
| 2004/0043627 A1 * | 3/2004 | Wieczorek | H01L 21/28185 |
| | | | 438/758 |

(Continued)

*Primary Examiner* — Edward Chin
(74) *Attorney, Agent, or Firm* — Oblon, McClelland, Maier & Neustadt, L.L.P.

(57) ABSTRACT

A method of forming a semiconductor device having a channel and a source-drain coupled to the channel. The method includes etching a channel region such that an end of the channel region forms a recess within a gate structure surrounding the channel region. An extension region is formed in contact with the channel region and at least partially filling the recess. Extension material of the extension region has a different composition from channel material of the channel region such that a strain is caused in the channel region. A source-drain region is in contact with the extension region and adjacent to the gate structure.

14 Claims, 14 Drawing Sheets

(56) References Cited

U.S. PATENT DOCUMENTS

2008/0135949 A1* 6/2008 Lo .................... B82Y 10/00
257/401
2012/0056258 A1* 3/2012 Chen ................ H01L 21/76254
257/316

* cited by examiner

EXTENSION REGION FOR A SEMICONDUCTOR DEVICE

CROSS REFERENCE TO RELATED APPLICATIONS

This application is based on, and claims the benefit of priority to, U.S. provisional application No. 62/373,164 filed on Aug. 10, 2016, the entire contents of which are incorporated herein by reference.

BACKGROUND

Field of the Disclosure

This disclosure relates generally to improvements to a semiconductor device. More particularly the present disclosure relates to improvements relating to a method of manufacturing the semiconductor device such as an integrated circuit, and transistors and transistor components for an integrated circuit.

Description of the Related Art

Manufacturing of a semiconductor device (especially on the microscopic scale) involves various fabrication processes such as film-forming depositions, etch mask creation, patterning, material etching and removal, as well as doping treatments, that are performed repeatedly to form desired semiconductor device elements on a substrate. Historically, with microfabrication, transistors have been created in one plane, with wiring/metallization formed above such plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

There remains a continuing need to provide scaling of improved and high performing semiconductor devices, as well as a need for corresponding manufacturing processes.

SUMMARY

According to an embodiment of the present disclosure, there is provided a method of forming a semiconductor device having a channel and a source-drain coupled to the channel. The method includes etching a channel region such that an end of the channel region forms a recess within a gate structure surrounding the channel region. An extension region is formed in contact with the channel region and at least partially filling the recess. Extension material of the extension region has a different composition from channel material of the channel region such that a strain is caused in the channel region. A source-drain region is in contact with the extension region and adjacent to the gate structure.

Another aspect includes a semiconductor device having a gate structure including a gate spacer, and a channel extending through the gate structure such that an end of the channel is recessed within a recess in the gate spacer. An extension region is in contact with the end of the channel within the recess, the extension region being formed of an extension material having a different composition than a channel material of the channel such that a strain is provided in the channel. A source-drain contact is in contact with the extension region and adjacent to the gate structure.

In still another aspect, a semiconductor device includes a p-type lateral nanowire coupled to a p-type source-drain region by a first connecting structure through a first opening in a gate spacer. An n-type lateral nanowire is provided in vertical stacked relation to the p-type nanowire and coupled to an n-type source-drain region by a second connecting structure through a second opening in the gate spacer. An electrode structure includes a p-type electrode contacting the p-type source-drain, and an n-type electrode contacting the n-type source-drain, the n-type electrode being electrically insulated from the p-type electrode by dielectric. At least one of said first and second connecting structures includes an extension doping region within a respective opening in the gate spacer. Further, according, to an embodiment of the present disclosure, there is provided a semiconductor device. The semiconductor device includes nanowires including a recess, and a gate spacer wrapped around the nanowires including a channel providing access to the recess in the nanowires, wherein the recess and the channel includes extension doping of silicon germanium. A depth of the recess is less than the width of the gate spacer.

The forgoing general description of the illustrative implementations and the following detailed description thereof are merely exemplary aspects of the teachings of this disclosure, and are not restrictive.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying figures are for illustration purposes only and may or may not represent actual or preferred values or dimensions. Where applicable, some or all features may not be illustrated to assist in the description of underlying features. In the drawings.

DETAILED DESCRIPTION

Figure 1:
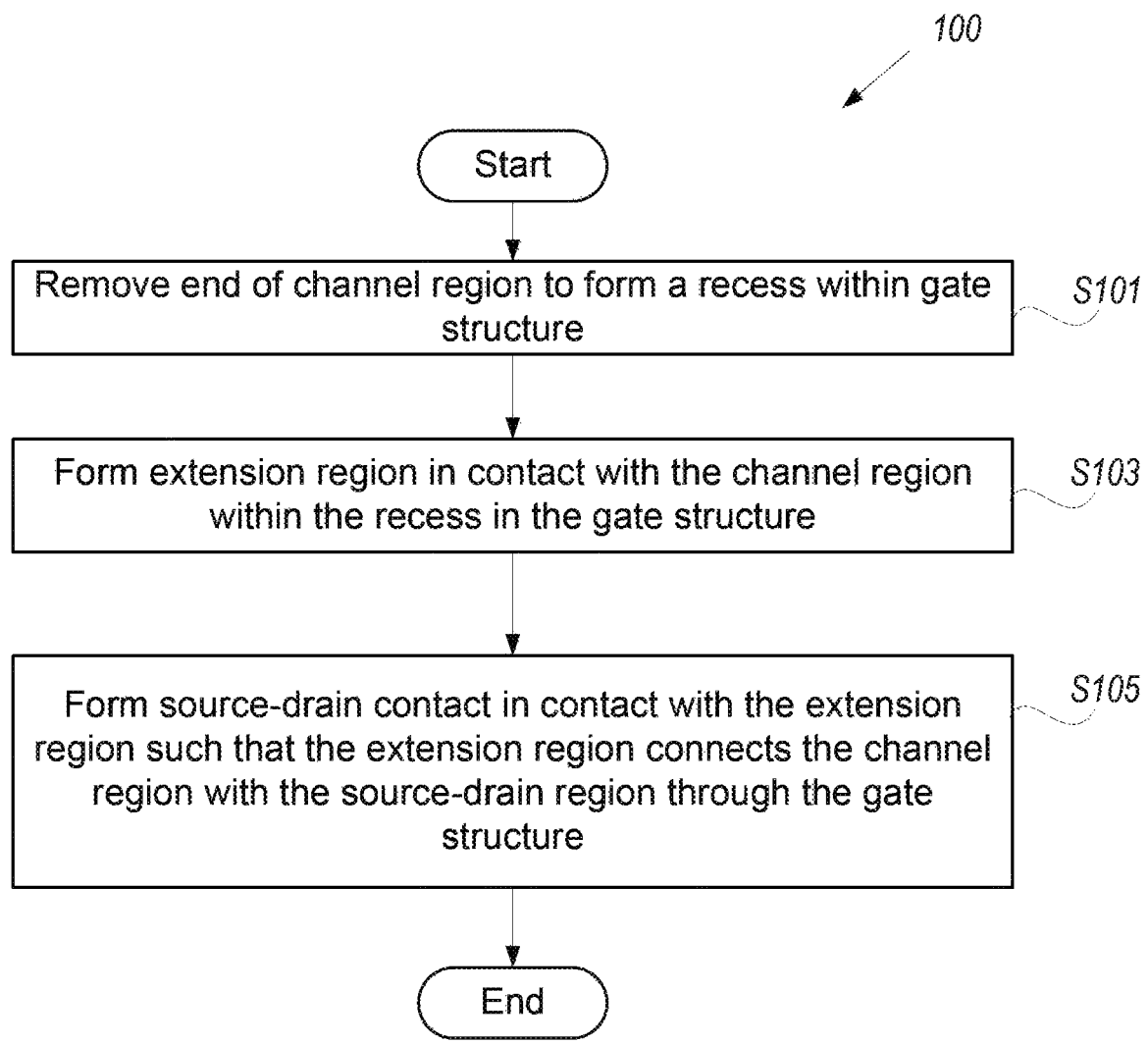
FIG. 1 is a flow chart of a manufacturing process for forming extension regions according to certain aspects of the present disclosure.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details. In some instances, well-known structures and components may be shown in block diagram form in order to avoid obscuring the concepts of the disclosed subject matter.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments. Further, it is intended that embodiments of the disclosed subject matter cover modifications and variations thereof.

It must be noted that, as used in the specification and the appended claims, the singular forms "a," "an," and "the" include plural referents unless the context expressly dictates otherwise. That is, unless expressly specified otherwise, as used herein the words "a," "an," "the," and the like carry the meaning of "one or more." Additionally, it is to be understood that terms such as "top," "side," "height," "width," "upper," "lower," "interior," "inner," and the like that may be used herein merely describe points of reference and do not necessarily limit embodiments of the present disclosure to any particular orientation or configuration. Furthermore, terms such as "first," "second," "third." etc., merely identify one of a number of portions, components, steps, operations, functions, and/or points of reference as disclosed herein, and likewise do not necessarily limit embodiments of the present disclosure to any particular configuration or orientation.

Furthermore, the terms "approximately," "proximate," "minor," and similar terms generally refer to ranges that include the identified value within a margin of 20%, 10% or preferably 5% in certain embodiments, and any values therebetween.

The terms "substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but for illustrative purposes only.

Techniques herein include integration and hardware methods to produce extension regions for semiconductor devices having a gate and source-drain (S/D) regions. FIG. 1 is a flow chart of an example manufacturing process for a forming semiconductor device having an extension region in accordance with embodiments herein. The process begins with an intermediate device structure including a gate structure with a channel region therein, prior to formation of the S/D regions. The method 100 begins in S101 by recessing an end of the channel region into the gate structure to form a recess. The recess is preferably deep enough to provide space for forming an extension region in the gate structure, but shallow enough to avoid exposure of gate structure materials (such as replacement gate materials) to source-drain region processing, and similarly to avoid exposure of source-drain region materials and/or extension region materials to gate, processing (such as removal of the replacement gate). The recess can be formed by etching of the channel material as will be further discussed in relation to specific examples below.

Once a recess is formed in the gate structure of a device, an extension region is formed at least partially within the recess as shown by S103. In one example, the extension region may be formed by epitaxial growth from the end of the channel material exposed in the recess formed by step S101. In this regard, the recess can provide a "guiding" structure such as a tunnel for the epitaxial growth to ensure that the eventual extension region matches the shape of the recess (or, for example, the shape of the removed channel material). The extension region has a different material composition from the channel material to cause a strain within the channel region for enhancing performance of the semiconductor device. For example, where the channel region is silicon (Si), the extension region can be (SiGe), and vice versa with an SiGe channel and Si extension. The extension material may be enriched and/or doped to affect operational characteristics of the semiconductor device. For example, where the extension material is SiGe it can be exposed to an enrichment process for increasing a relative amount of germanium. Additives such as semiconductor dopants or other materials such as carbon or other neutral species can be provided in the extension region to affect device characteristics. Such materials can be added in-situ by epitaxial growth, diffusion or other semiconductor processes. In one embodiment, materials such as $B_2O_3$, Ga, ZnO, TiO can be used to shift a contact metal workfunction to the source and drain.

Once the extension region is formed at an end of the channel, as seen in step S105, doped S/D contacts are formed within a S/D region of the device adjacent to the gate structure. The extension region will therefore be situated between the end of the channel and the S/D contact such that the extension region connects the channel to the S/D contact through a portion of the gate structure such as a gate spacer. Various dopant materials may be used in the S/D contact material (and the extension material). For example, the S/D contacts may be doped with boron for p-channel devices, or doped with phosphorous for n-channel devices. These dopants can be provided in-situ with forming the S-D contacts and/or by subsequent processing such as ion implantation. A spike anneal process can be optionally executed to diffuse dopants from the S/D contacts into the extension region, and/or to further tailor the diffusion profile of dopants existing within the formed extension region. The annealing process can also diffuse dopants into the original channel materials.

Once the S/D contacts are formed, conventional processing can be done such as opening of a replacement gate, releasing the channel material, gate metallization for the channel, S/D metallization etc., as discussed further below.

Techniques herein for providing an extension region can pertain to device fabrication using gate-all-around processing incorporating nanowires or nanosheets in a nanowire field effect transistor (FET) and/or stacked complementary FET device. Gate-all-around (GAA) identifies a FET device in which a metal gate is physically wrapped around a silicon or silicon/germanium nanowire. GAA is a further extension of the tri-gate process where the gate is wrapped around a silicon or silicon/germanium fin; with fin FETs, the gate wraps around on three of four sides, while with GAA FET devices, the gate wraps around all sides of a given channel (whether the given channel has a rectangular or circular cross-section). One type of a GAA FET device is a nanowire FET.

In nanowire FET devices, current is supplied through the nanowire or nanosheet channel via a S/D contact in which doped semiconductor material (e.g., SiGe or Si) is charged via a metal S/D electrode that is connected to upper interconnect and/or metallization layers of the device. Doped semiconductor material formed by epitaxial growth, for example, can additionally provide a mechanism for straining to enhance drive current through the FET. The present inventors have recognized that a S/D epitaxy extension can be created in nanowire or nanosheet semiconductor devices in order to meet device performance or design specifications, for example. According to the present disclosure, such extensions can increase the strain at the end of a nanowire channel to enhance drive current, for example.

Figure 2:
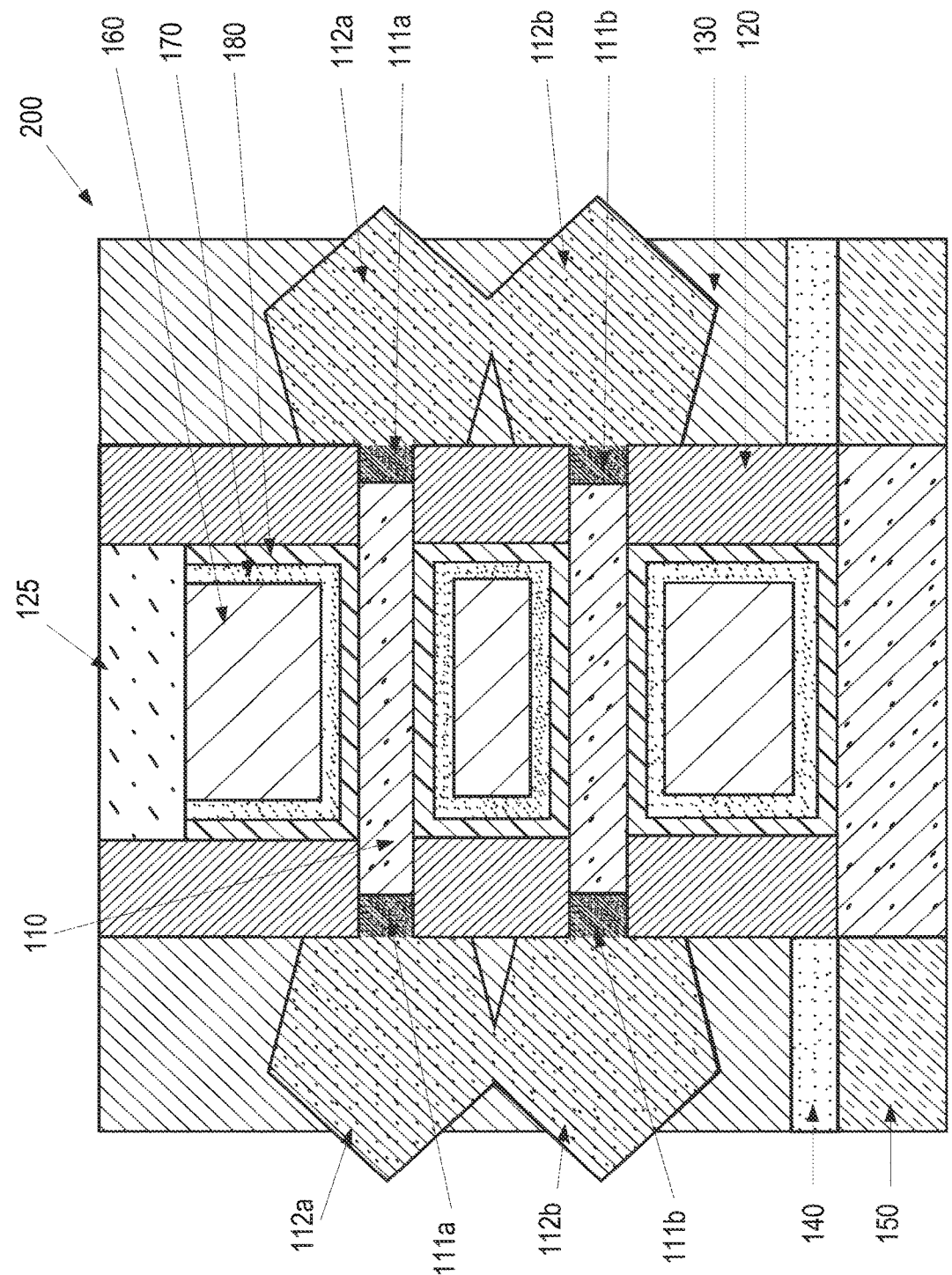
FIG. 2 is a cross-section view of a semiconductor device according to certain aspects of the present disclosure.

FIG. 2 is a cross-section of a multi-channel FET device having extension regions according to embodiments of the disclosure. Device 200 includes a gate structure and source-drain regions coupled to the gate structure to form a nanowire FET device. In the embodiment shown, the gate structure includes nanowires 110 that function as a current channel for the device 200 (i.e. multi-channel device). The gate structure also includes a metal fill 160, a work function material (WFM) 170, and a high-k dielectric material 180 surrounding the nanowires 110 as well as a gate cap 125 which covers these materials. In the embodiment of FIG. 1, a gate spacer 120 is also considered to form part of the gate structure, and is wrapped around opposing end regions of the nanowires 110.

The S/D regions of the device 200 include S/D contacts 112a and 112b formed on either side of the gate structure adjacent to the gate spacer 120. S/D contacts 112a and 112b are surrounded by S/D metal 130 forming the S/D electrode (also referred as S/D bar) in the S/D region. In FIG. 1, the S/D contacts 112a and 112b are connected or merged with each other and metal 130 provides a single S/D electrode for both S/D contacts 112a and 112b. Alternatively or in addition, in some implementations, the S/D regions 112a and 112b may be separated to provide separate contacts for each nanowire 110, as will be discussed with respect to FIG. 5 below. Etch stop layer (ESL) 140 and shallow trench isolation (STI) oxide coating 150 are also shown in the device 200.

Structure 200 also includes nanowire extension regions 111a, 111b that originate from within notches (or recesses) in the gate spacer 120 at ends of nanowires 110. Thus, in the embodiment of FIG. 2, the extension regions 111a and 111b connect the nanowires 110 to the S/D contacts 112a and 112b through an opening in the gate spacer 120. The extension regions 111a and 111b can be doped and/or can provide increased strain at the end of the nanowires 110 to improve device performance. The extension regions 111a and 111b are formed of an extension material having a different composition from the material of the S/D contacts.

Figure 3:
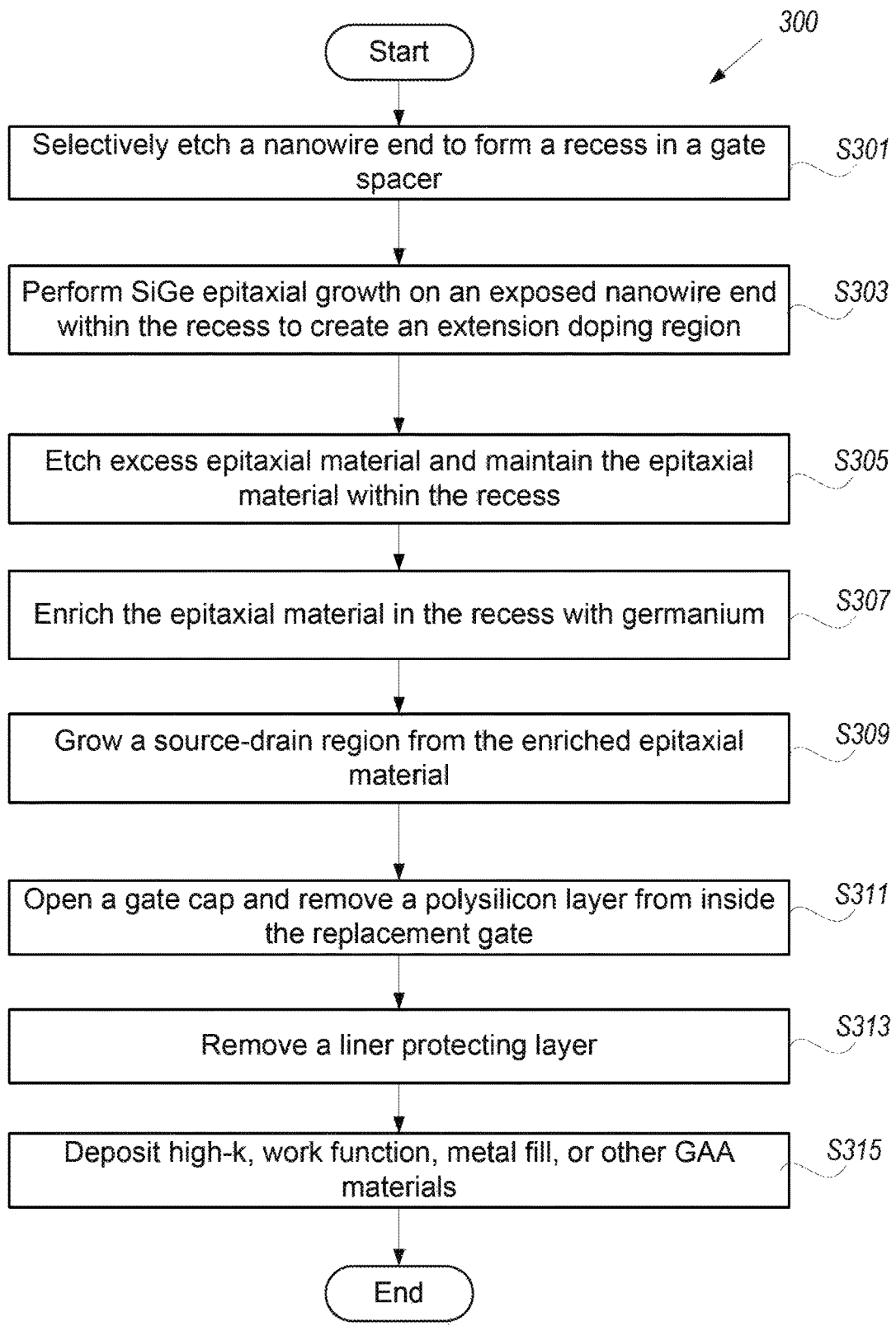
FIG. 3 is a flowchart of a manufacturing process for extension doping according to certain aspects of the present disclosure.

FIG. 3 is a flow chart of an example process for manufacturing a specific device having a structure 200 of FIG. 2. FIGS. 4A-4J illustrate structures at various stages in the process of FIG. 3. As known in the art, nanowire or nanosheets can be formed from a "fin" structure of alternating semiconductor materials, such as Si and SiGe. Silicon nanowire formation can be accomplished through isotropic etching of the SiGe in the fin, and formation of a gate spacer material which terminates at the end of the silicon wires on either end of the gate structure. Similarly, SiGe nanowires can be formed by selectively etching Si in the fin relative to SiGe. Techniques herein are applicable to both Si and SiGe nanowires or nanosheets, as well as to other similar semiconductor structures. For convenience in explaining embodiments herein, the description in FIGS. 3 and 4A-4J is directed to a process where silicon nanowires are produced. Thus, FIGS. 3 and 4A-4J disclose an integration and hardware method to produce extension regions for silicon nanowires of a semiconductor device.

Figure 4A:
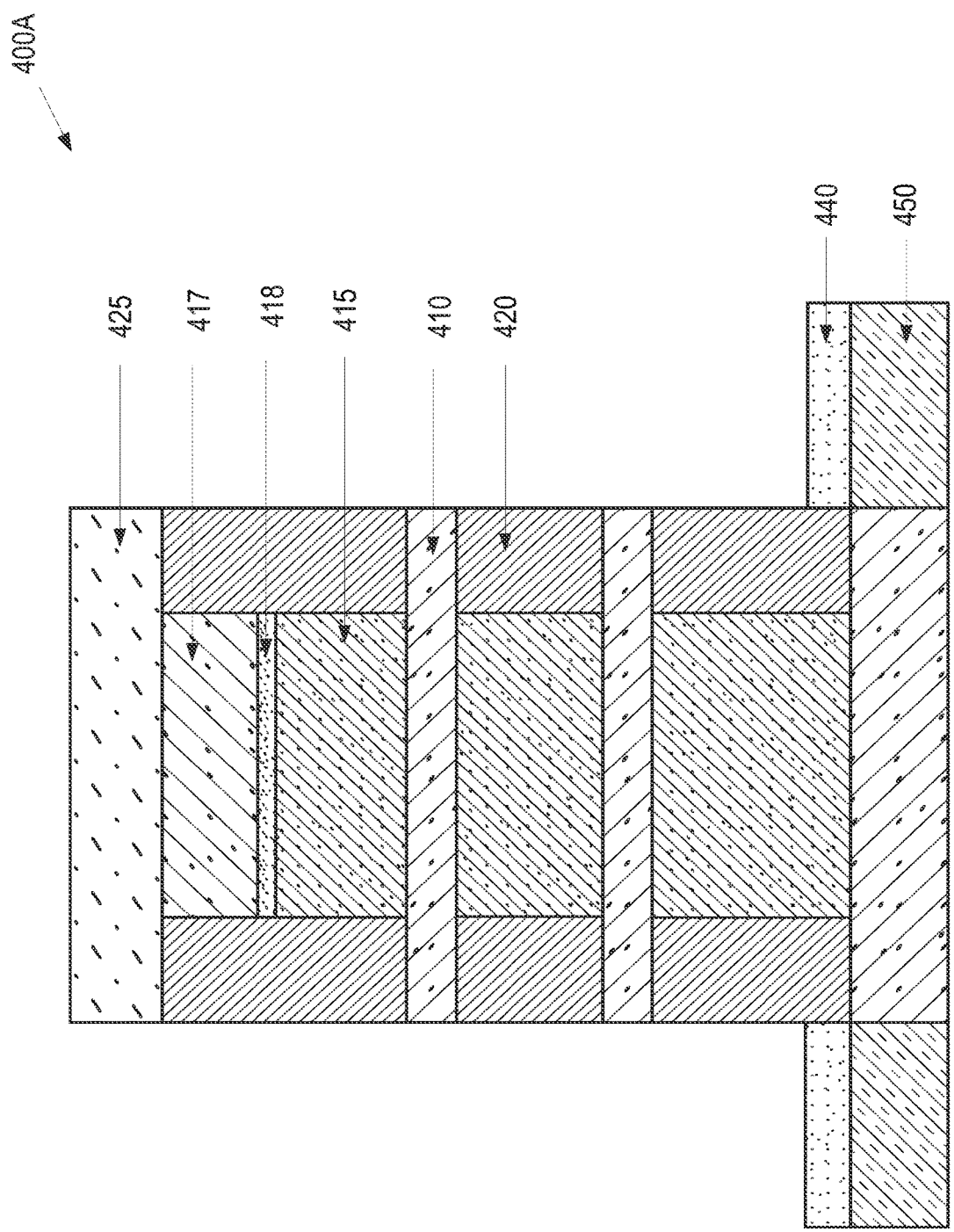
FIG. 4A is a cross-section view of an example starting structure for manufacturing the device of FIG. 1 according to certain aspects of the present disclosure.

The method 300 of FIG. 3 may start with a semiconductor structure such as the example structure 400A shown in FIG. 4A. The structure 400A shows a gate structure at an intermediate stage in device processing. The structure 400A includes Si nanowires 410 and SiGe region 415 of a fin structure, as well as polysilicon material 417. The SiGe 415 and polysilicon 417 are sacrificial layers that will be removed to release the nanowires 410 later in the process. SiGe region 415 has can have approximately 20% germanium (Ge), but other stoichiometry may be used. In the structure 400A, the fin structure including nanowires 410 are protected by a liner 418 such as SiO, and the polysilicon is protected by a cap layer 425. The structure 400A may be referred to as a "replacement gate."

The structure 400A also includes a gate spacers 420 wrapped around end regions of the nanowires 410 on opposing sides of the replacement gate. The gate spacer 420 will electrically insulate the gate region from the S/D region of the end device. ESL (etch stop layer) 440 and STI (silicon trench isolation) oxide 450 are also shown.

Figure 4B:
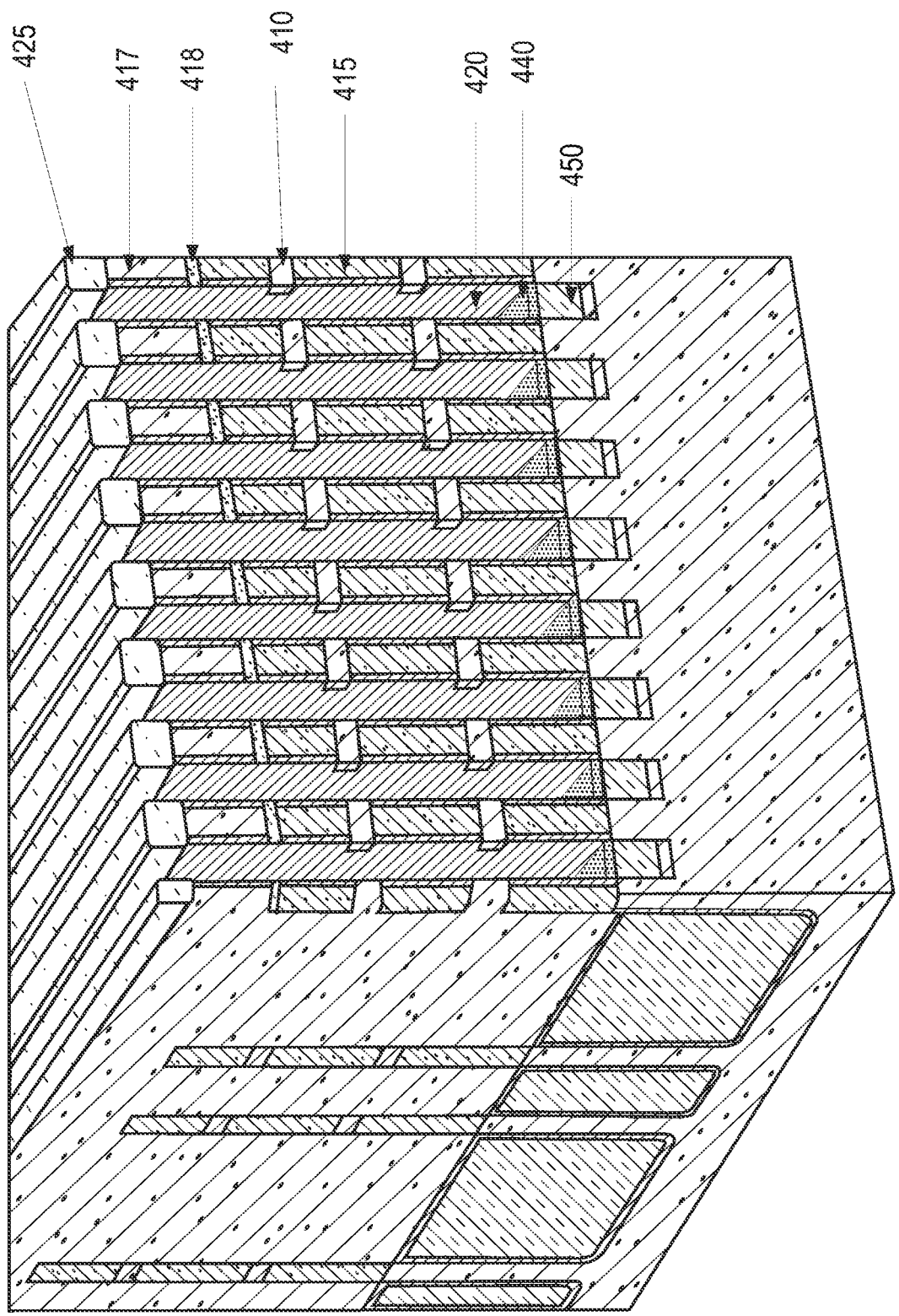
FIG. 4B is a three dimensional rendering of the example structure of FIG. 4A according to certain aspects of the present disclosure.

A three-dimensional (3D) rendering of the cross-section of the structure 400A is illustrated in FIG. 4B. In FIG. 4B, it is more apparent that the Si/SiGe fins run through the replacement gate composed of polysilicon 417, and that the nanowires 410 extend through the gate spacer 420.

Figure 4C:
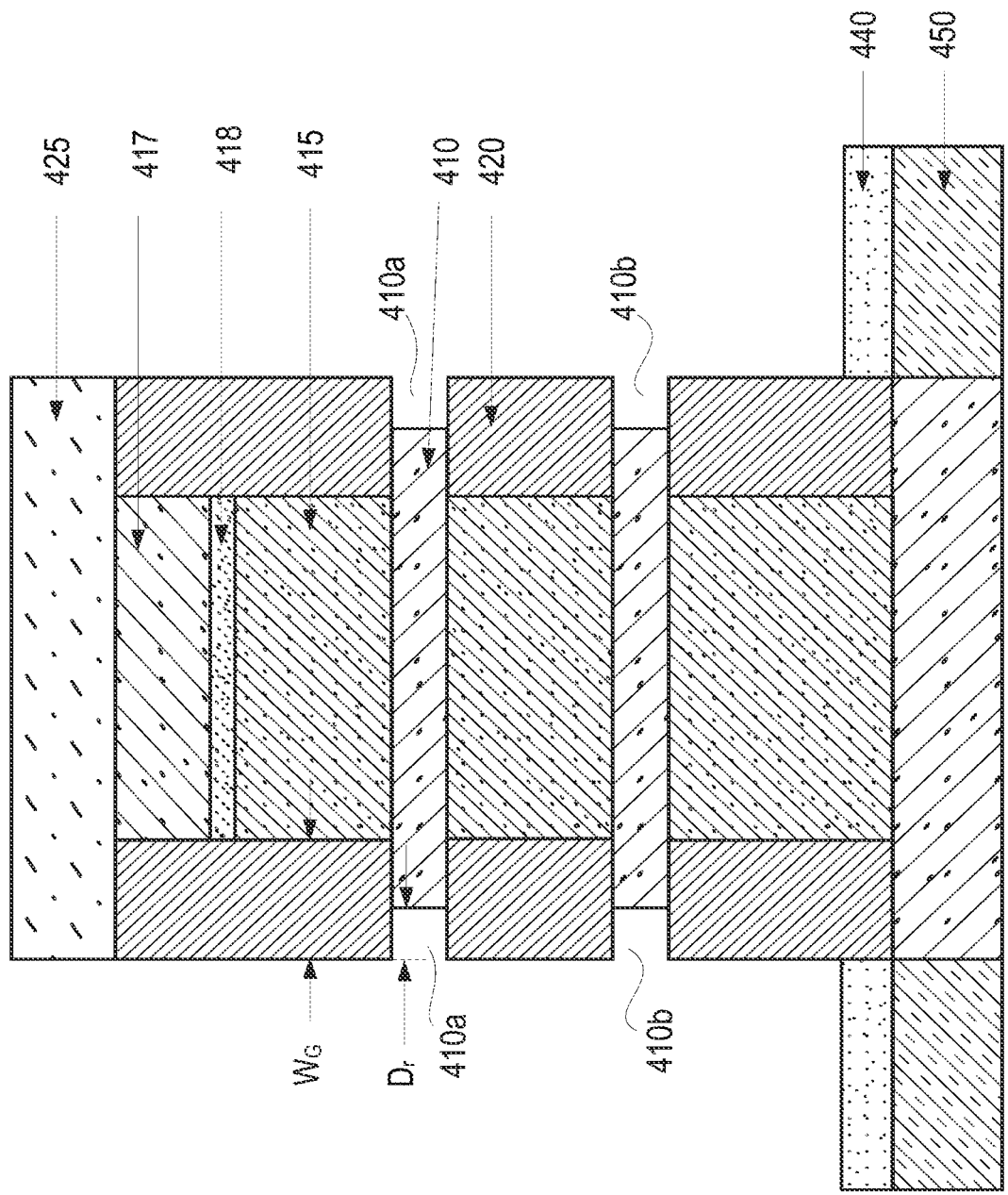
FIG. 4C is a cross-section view of the semiconductor after completion of a first step of the manufacturing process in FIG. 3 according to certain aspects of the present disclosure.
Figure 4D:
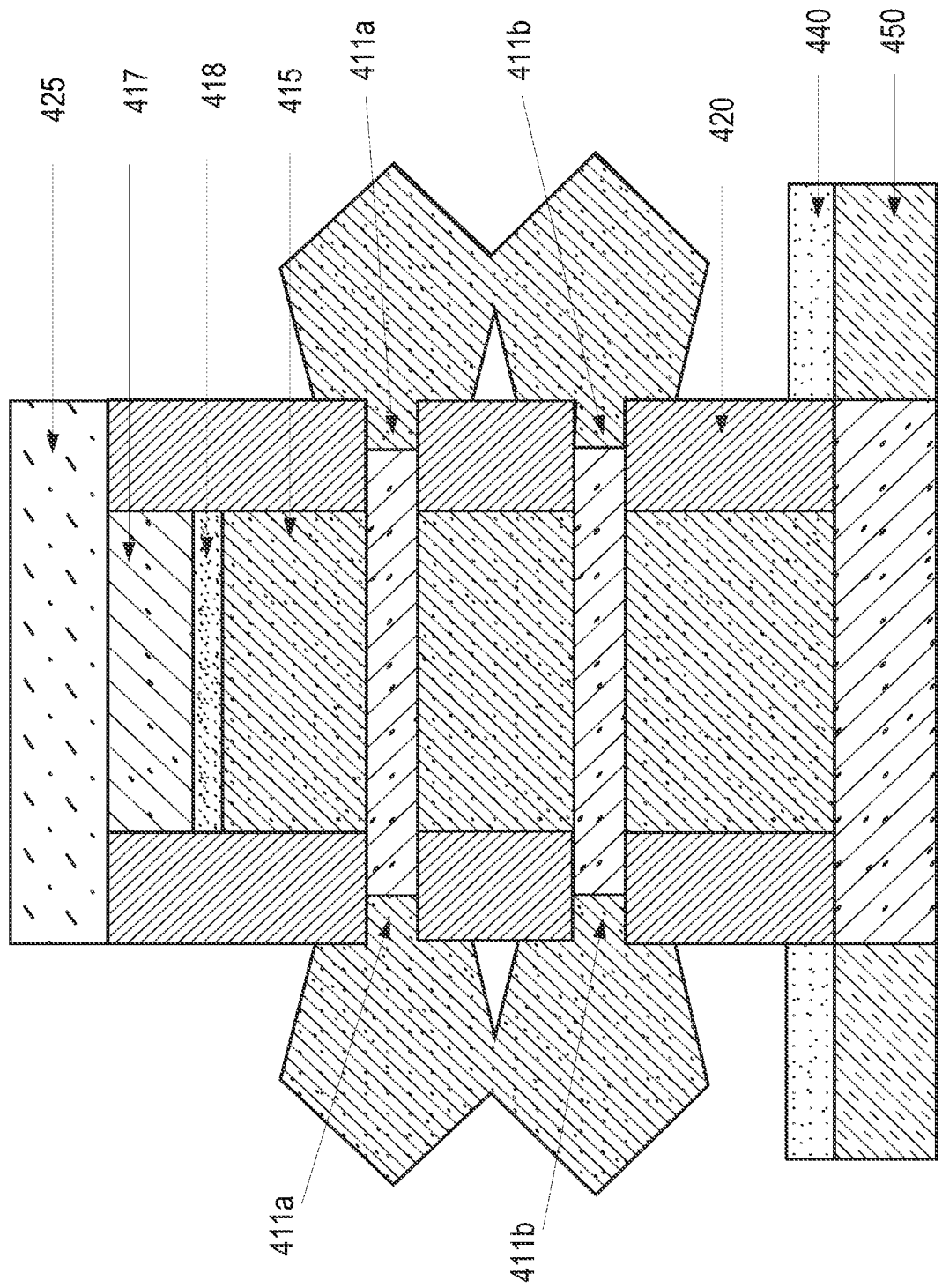
FIG. 4D is a cross-section view of the semiconductor after completion of a second step of the manufacturing process in FIG. 3 according to certain aspects of the present disclosure.

Returning to FIG. 3, in step S301 of the process, the Si nanowires 410 are selectively etched into the gate spacer 420 to form recesses. An example result of step S301 is illustrated in FIG. 4C. As seen, the recesses 410a and 410b have a depth Dr within gate spacer 420 having a thickness or width $W_G$, which is typically 30-100 Angstroms, for example. The material of nanowire 410 is not removed all the way through the width $W_G$ of the gate spacer 420. The recess depth Dr can range from several Angstroms to any depth that is less than a thickness or width $W_G$ of the gate spacer 420. The depth Dr should be enough to provide an area within the gate spacer 420 for the extension region to be formed, but limited to prevent punch through of the recess 410a and 410b through the gate spacer 420. Complete material removal (i.e., beyond the width of the gate spacer 420) can expose SiGe regions 415 in the fin to downstream processing of the S/D region (such as etch), and similarly expose S/D materials to gate processing, which can be undesirable. Thus, in some embodiments, the target recess depth Dr should be set to ensure that punch through will not occur when considering process control limits and manufacturing variance of downstream processing steps of the substrate.

In some embodiments the recess depth Dr is controlled such that some SiGe can be grown from the end of the recessed wire and a tunnel created within the gate spacer through the silicon recess etch can help maintain a consistent wire-shaped epitaxial growth from the end of the wire. In some embodiments, a maximum depth can be a function of the low-k gate spacer thickness and proportional to the thickness of the gate spacer. It should be noted that, the recess should not go all the way through the low-k spacer. In some examples, the low-k spacer can be anywhere from 40 A to 80 A in width, depending on the technology and the depth of recess can be 10 A to 20 A, or roughly 20-25% of the thickness of the low-k spacer.

A particular depth $D_r$ of recesses 410a and 410b can be controlled through an atomic layer etch (ALE), a quasi-ALE, or through selective vapor phase etching. All three processes have excellent selectivity of silicon to silicon germanium, as well as for the opposite selectivity case of SiGe to Si. Furthermore, the selectivity can be relative to the gate spacer material (e.g., material with a low-k value). In some examples of present disclosure, for the low-k gate spacer, such selectivity between Si and SiGe may be desired, for example in PMOS having SiGe wires or Ge wires, and NMOS having Si wires. Other methods may be used to form the recesses 410a and 410b. In one example, the recess etching can be accomplished through an isotropic vapor phase etch process, for example, using a CERTAS tool manufactured by TOKYO ELECTRON LTD. The CERTAS tool etch can achieve over 100:1 selectivity between the silicon wire and the gate spacer material, for example. Alternatively, the recess etch may be executed through atomic layer etch (ALE) or quasi-atomic layer etch (quasi-ALE) in order to selectively recess the silicon wire by Angstrom-scale dimensions.

In step S303 of FIG. 3, an epitaxial growth of SiGe on the exposed silicon nanowires 410 in the recess is performed to create the extension regions 411a and 411b (collectively referred to as extension 411 hereinafter). In one embodiment, referring to FIG. 4D, the extension doping 411 can be grown as a typical S/D epitaxial growth from the recessed nanowires 410 and extending into the S/D region. However, growth of the extension region 411 may be confined to within the recesses.

Since the recesses 410a and 410b formed in S301 did not expose any of the SiGe 415 or polysilicon 417 from the gate structure (inside the gate spacer 420), the epitaxial growth of SiGe in the extension region will originate only from the end of the nanowires 410, and not from gate structure materials such as SiGe 415. Based on a p-wire (i.e. p-channel) n-wire (i.e. n-channel) device, either epitaxial SiGe or epitaxial Si can be grown. In the example of FIGS. 3 and 4A-4J, the extension region 411 is SiGe epitaxy. This provides a lattice mismatch with the Si nanowire 410, which creates a strain in the nanowire channel to affect device characteristics.

In some implementations, the extension regions 411 can be doped with dopant materials. Various dopant materials may be used depending on the type of device to be manufactured. Doping may be performed in-situ during epitaxial growth of the extension region 411, or by subsequent processing after growth of the extension region. In the example process of FIGS. 3 and 4A-4J, the SiGe extension regions 411 are doped with boron in-situ by epitaxial growth of SiGe:B from an end of the Si nanowire 410. The composition of SiGe:B can be anywhere within a range of 20% Ge (consistent with the Ge content of the SiGe 415 in the fin) to 100%. In some embodiments, preferably extensions regions having 20% to 50% Ge can be used as a starting point and further enriched to get higher Ge % to possibly pure (100%) Ge. In some embodiments, a relatively less defective epitaxial growth for Ge % <50% can be observed. For a relatively higher Ge % by epitaxial growth can be achieved by a buffer layer/graded layer, which is added to overcome the lattice mismatch between Si and Ge.

Figure 4E:
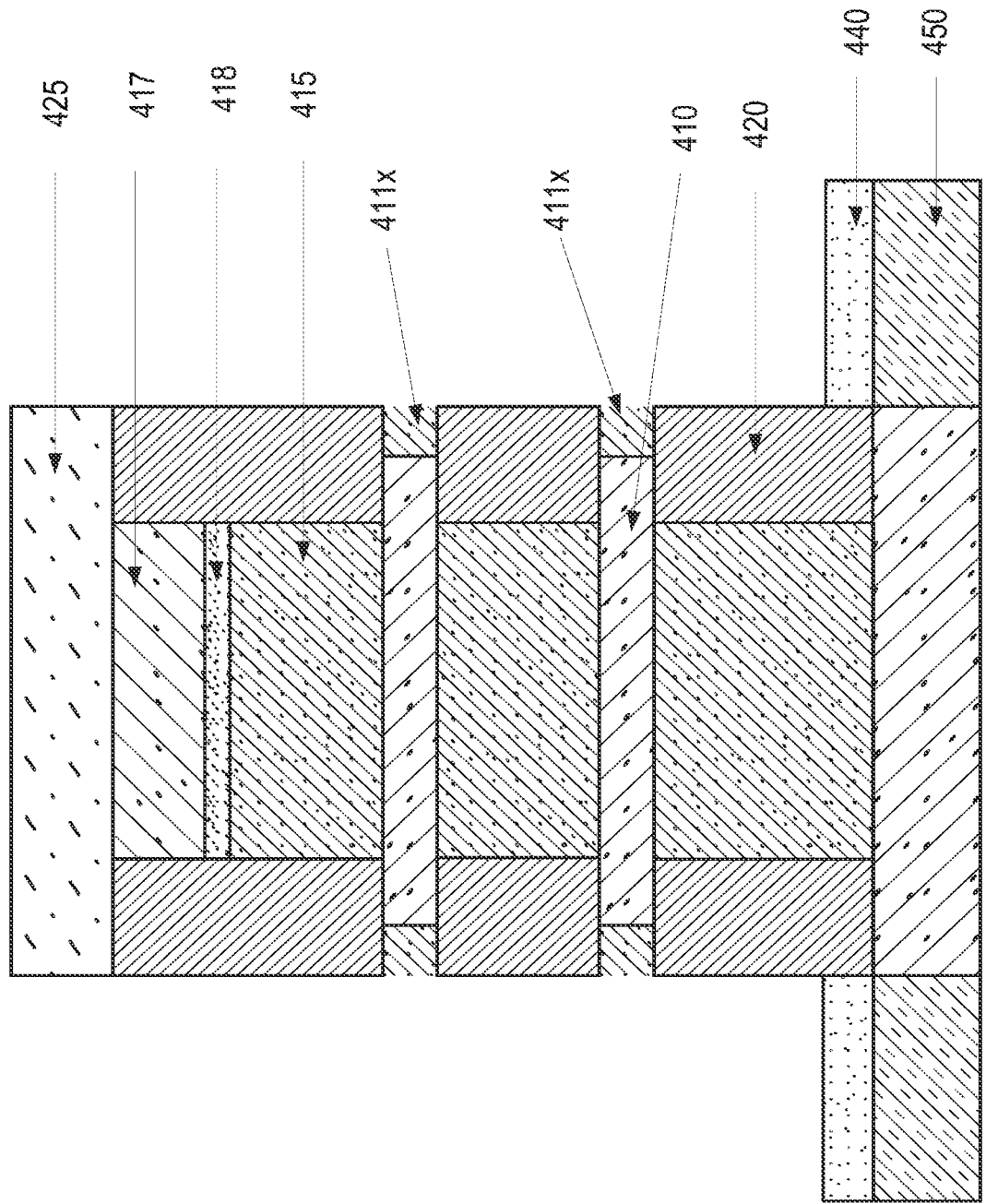
FIG. 4E is a cross-section view of a semiconductor after completion of a third step of the manufacturing process in FIG. 3 according to certain aspects of the present disclosure.

In step S305 of FIG. 3, any epitaxial growth outside of the gate spacer 420 (or recess 410) is removed. An example result of the step S305 is illustrated in FIG. 4E. The epitaxial SiGe:B material can be etched such that the material will approximately remain in a region between the end of the nanowire 410 and the outer edge of the gate spacer 420. Thus, as seen in FIG. 4E, a doped extension region 411x is preserved within the recess 410. Removal of the SiGe:B can be done through vapor-phase etch where selectivity between Si and SiGe (relative to gate spacer material 420) can achieve a ratio of over 100:1 using CERTAS system manufactured by TOKYO ELECTRON LTD., or through a straight-down anisotropic etch where the gate cap 425 and gate spacer 420 define portions of the extension region 411 material that can be etched away and portions that can remain.

Figure 4F:
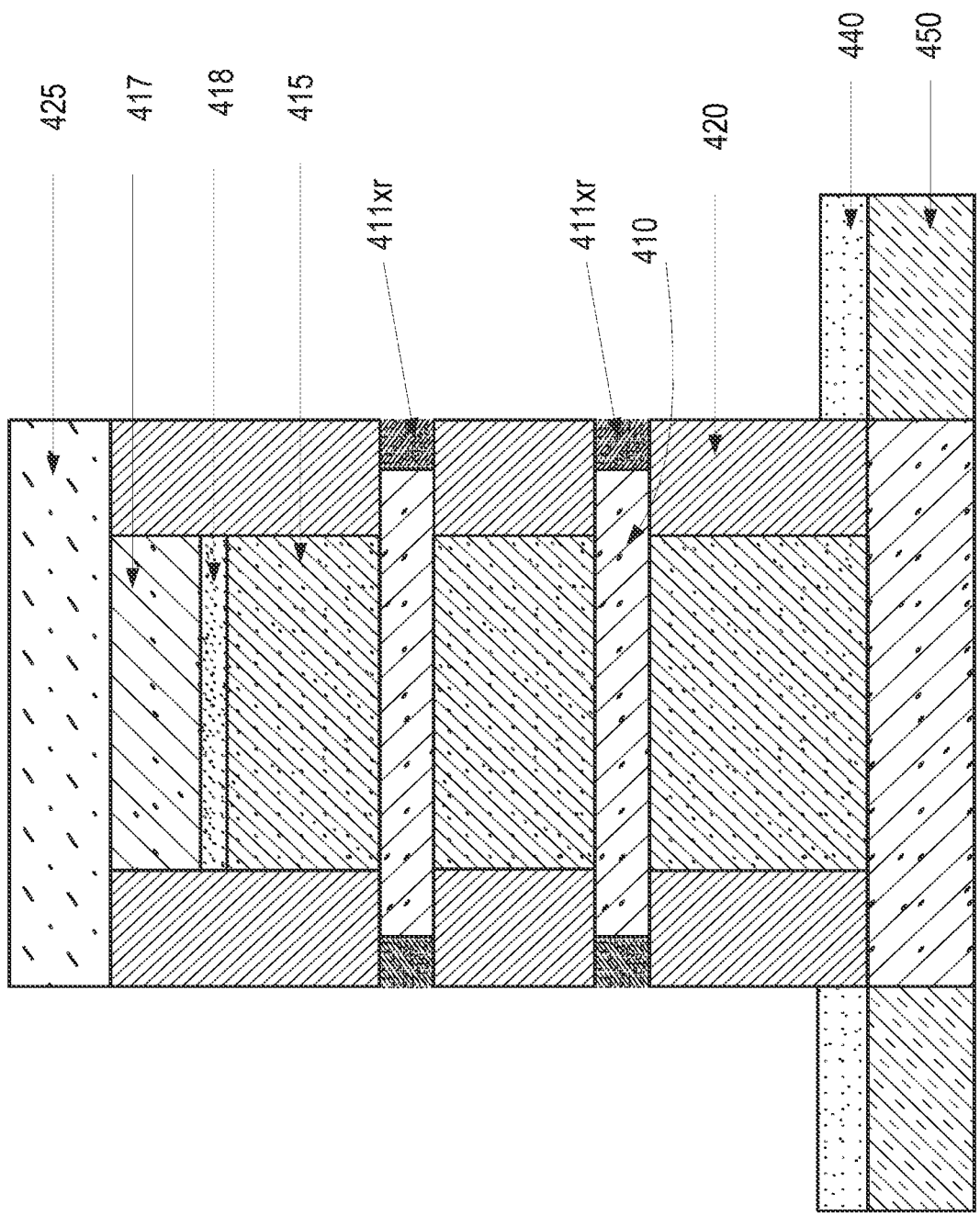
FIG. 4F is a cross-section view of a semiconductor after completion of a fourth step of the manufacturing process in FIG. 3 according to certain aspects of the present disclosure.

Once the excess epitaxial growth (e.g. outside the gate spacer 420) is removed, the remaining material within the recess 410a and 410b can be enriched in step S307 of FIG. 3. As seen in FIG. 4F, the doped extension region 411x becomes an enriched doped extension region 411xr. In the example described, the SiGe:B of the doped extension region 411x is enriched with germanium such that the enriched doped extension region 411xr provides SiGe:B having a greater amount of Ge relative to the epitaxially grown SiGe:B. In one example, the epitaxially grown SiGe:B includes 20-70% Ge, while the enriched SiGe:B provides some increased percentage of Ge content. In some examples, an epitaxial SiGe can in a range from Si(80%)Ge(20%) up to Si(50%)Ge(50%).

The enrichment process of step S307 can be, for example, a plasma condensation process, which can be executed, for example, by SPA surface wave plasma equipment manufactured by TOKYO ELECTRON LTD. The SPA process, for the case of SiGe, removes Si leaving a more germanium-rich material at the interface of the nanowire 410. Other enrichment processes can be used. A richer germanium in the extension region 411 can provide not only increased doping concentration at the interface between the nanowire 410 and the S/D contact which will be regrown from the extension region, but also provides additional strain to allow better drive current through the nanowire 410 from the S/D contact, for example. Since the nanowire 410 is not fully recessed through the gate spacer 420, any SPA treatment will not impact any Si or SiGe within the replacement gate 420 prior to release of materials inside the replacement gate 420.

Once the extension regions 411 are formed at the ends of the nanowire 410, epitaxial growth of doped semiconductor material can be done in order to form the S/D contacts. The extension region 411 will therefore be situated between the ends of the nanowire 410 and the S/D contact 412. In the embodiment discussed, in step 309, the S/D contacts 412 are epitaxially grown from the enriched extension region 411$xr$, which effectively becomes a doping extension region for the S/D contacts. These S/D contacts can have a germainium content consistent with that of the enhanced extension region 411$xr$. Thus, the S/D contact SiGe:B may be 20% to 70% Ge.

Figure 4G:
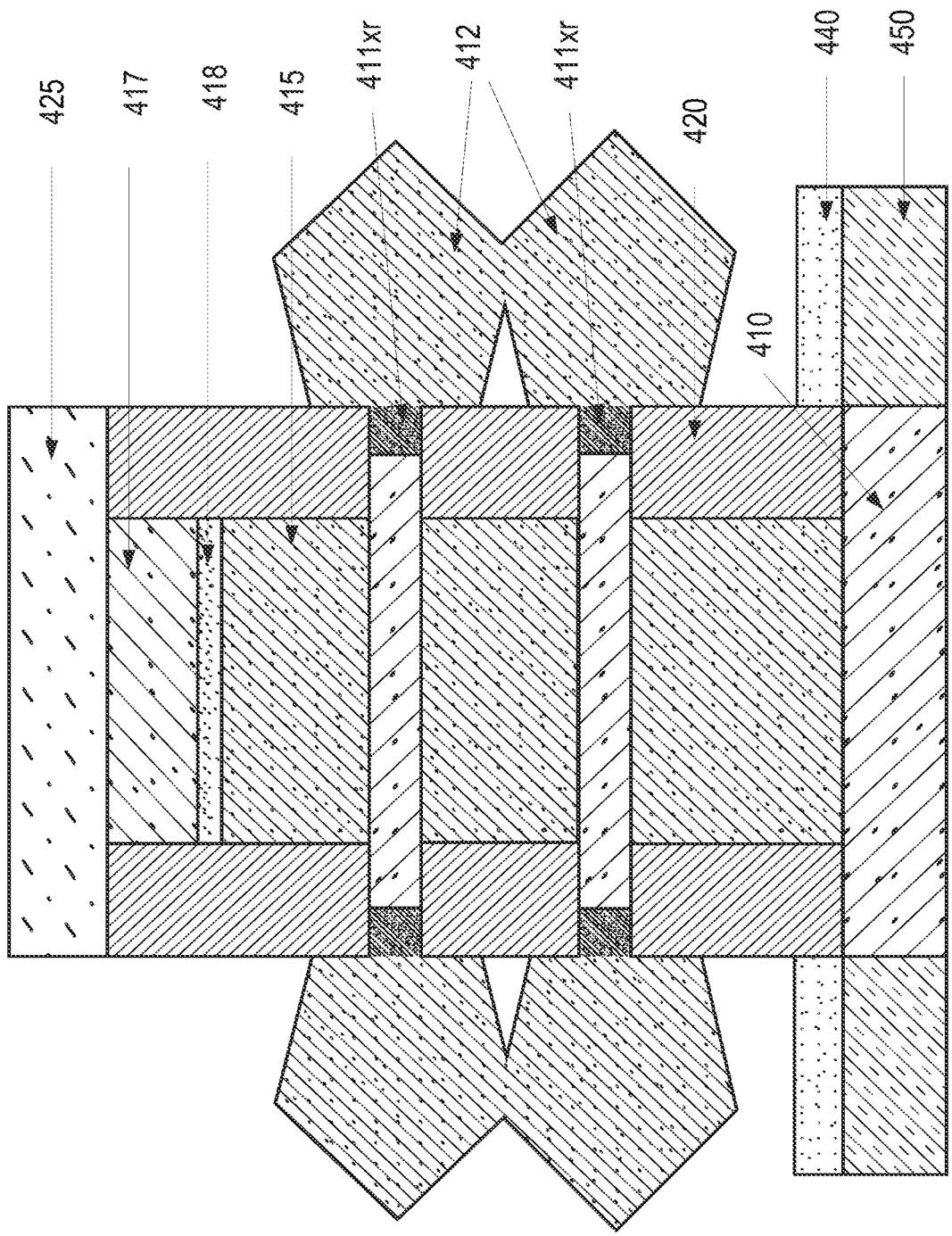
FIG. 4G is a cross-section view of a semiconductor after completion of a fifth step of the manufacturing process in FIG. 3 according to certain aspects of the present disclosure.

After forming the S/D contacts 412, a spike anneal process can be optionally executed. The S/D spike anneal process can be executed to drive the boron dopants from the S/D contact 412 into the extension region 411$xr$ and into the ends of the silicon wire 410. An example result of the step S309 is illustrated in FIG. 4G.

Figure 4H:
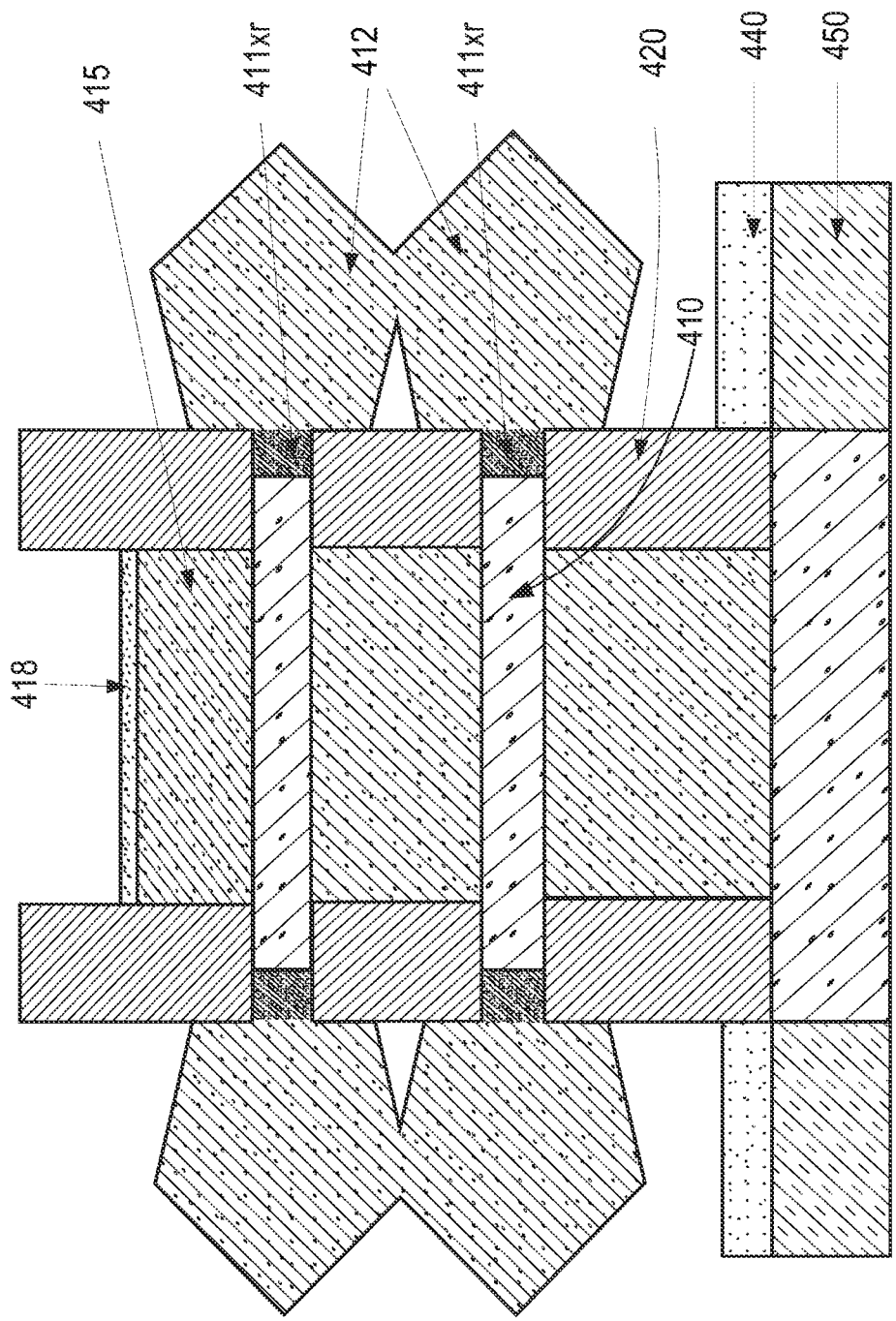
FIG. 4H is a cross-section view of a semiconductor after completion of a sixth step of the manufacturing process in FIG. 3 according to certain aspects of the present disclosure.

Once the S/D contact 412 is completed, conventional nanowire or nanosheet processing can be performed. Specifically, following the spike anneal, the gate cap and polysilicon can be removed as shown by S311. The gate cap 425 over the replacement gate can be opened via a selective etching process, and the polysilicon 417 can be isotropically removed through either wet process or through a vapor phase etch process. A result is shown in FIG. 4H. The Si/SiGe fin (i.e. Si nanowires 410 and SiGe regions 415) is protected from this polysilicon removal etch process by selective liner 418 deposited overtop the fin prior to forming the replacement gate module. The doped SiGe in S/D contacts 412 is protected from the etch by filling the S/D region with a selective material such as flowable oxide (not shown here) which can be polished down to the same height of the gate cap 425 prior to removal of the gate cap.

Figure 4I:
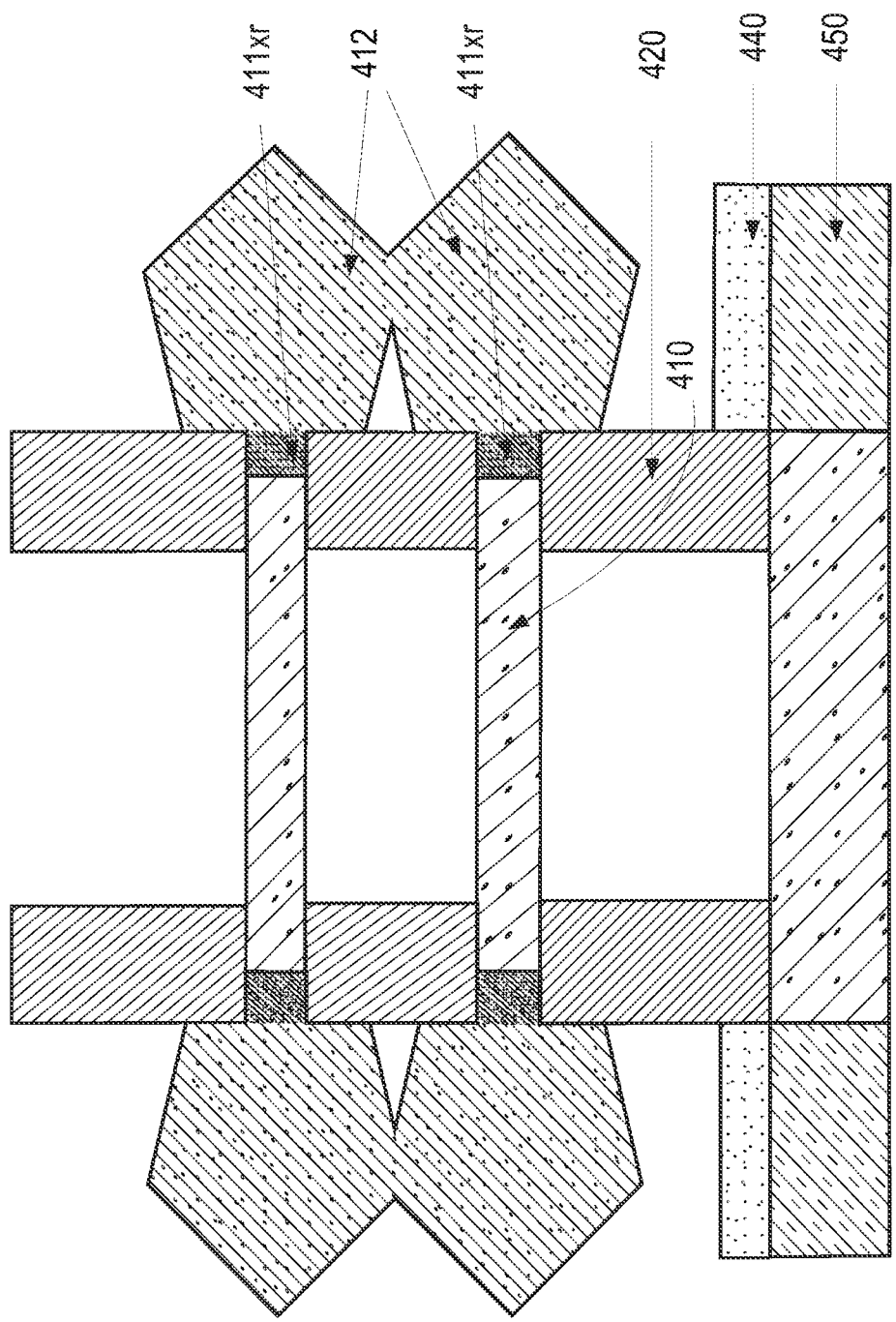
FIG. 4I is a cross-section view of a semiconductor after completion of a seventh step of the manufacturing process in FIG. 3 according to certain aspects of the present disclosure.

In step S313 of FIG. 3, the Si nanowires 410 are released to provide the structure of FIG. 4I. More specifically, after the polysilicon 417 has been removed from inside the replacement gate 420, the liner 418 protecting the Si/SiGe fin (i.e. Si nanowires 410 and the SiGe 415) inside the replacement gate can be removed. The doped SiGe material of the S/D contacts 415 is again protected by being buried within a non-selective film such as flowable SiO. The SiGe regions 415 can be removed through a vapor-phase etch which is purely isotropic and has over 100:1 selectivity to the Si nanowires 410 to be released. Such selective etching process is facilitated, for example, by TOKYO ELECTRON LTD. CERTAS system. Once the SiGe from inside the replacement gate 420 is removed, as seen in FIG. 4I, what remains physically inside the gate spacer 420 are nanowires 410 supported on either end of the gate by the gate spacer 420, which was wrapped around the nanowire 410 earlier in a gate module generation process.

Figure 4J:
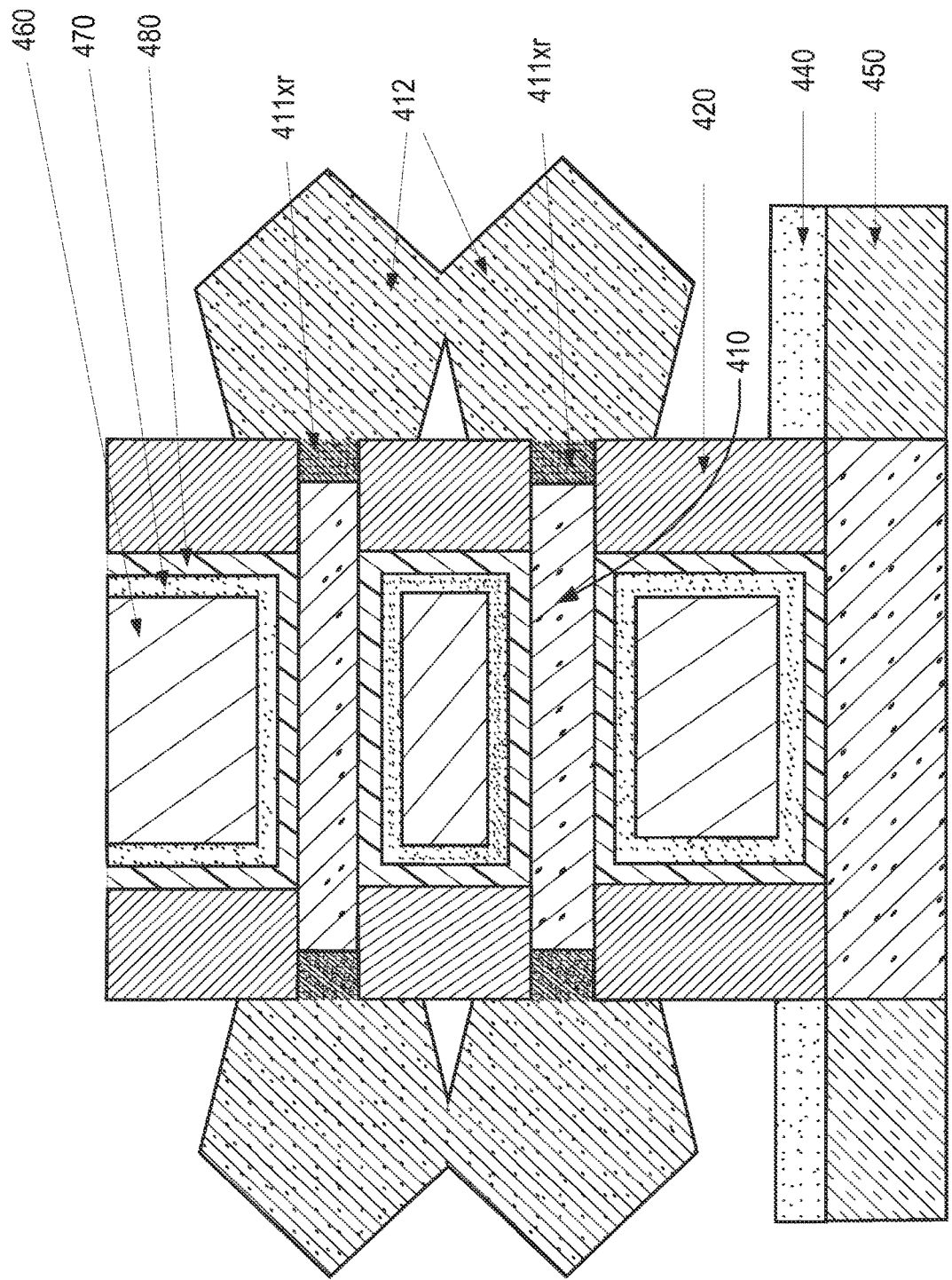
FIG. 4J is a cross-section view of a semiconductor after completion of an eighth step of the manufacturing process in FIG. 3 according to certain aspects of the present disclosure.

In step S315, a high-k, a work function, and metal fill materials can be deposited around the nanowires 410 and inside the gate spacer 420 forming what is generally called gate-all-around (GAA) where the doping extension 411 is maintained at the end of the nanowire 410 at the terminal end of the gate spacer 420. An example result of the step S315 is illustrated in FIG. 4J. In FIG. 4J, the high-k 480, the work function metal 470, and the metal fill 460 in the gate spacer 420 can be recessed and capped with a dielectric cap 425. A self-aligned-contact (SAC) etch can then be performed to remove the SiO from the S/D region (SiO not shown in this image) and the S/D bar can then be filled with metal to form the metal S/D electrode. An example result is illustrated in FIG. 2 previously discussed.

Extension regions may be used in GAA devices other than the multichannel nanowire FET device of FIG. 2. One of the benefits of a GAA or nanowire FET is that the device can be made to be complementary in that n-FET and p-FET (n-type FET material and p-type FET material) wires can be stacked on top of one another in order to provide significant area scaling of a logic device. The present inventors recognized that extension doping and may be used to compensate for decreased source/drain contact size compared to a multichannel FET device such as that shown in FIG. 2, where S/D epi is allowed to grow and physically touch between upper and lower wires. For an application of complementary FET, the upper and lower wires correspond to either nFET or pFET individually and are separated within the S/D bar region by the dielectric film and may pass through either a common gate or through a modified stacked PMOS/NMOS gate. Given size requirements for fin aspect ratio in the complementary FET device fabrication process, the S/D contact size of the complementary device can be substantially smaller compared to its conventional multi-channel device, due to the need to isolate each channel individually. The present inventors have recognized that extension regions and can improve device performance to compensate for such reduced S/D contact area.

Figure 5:
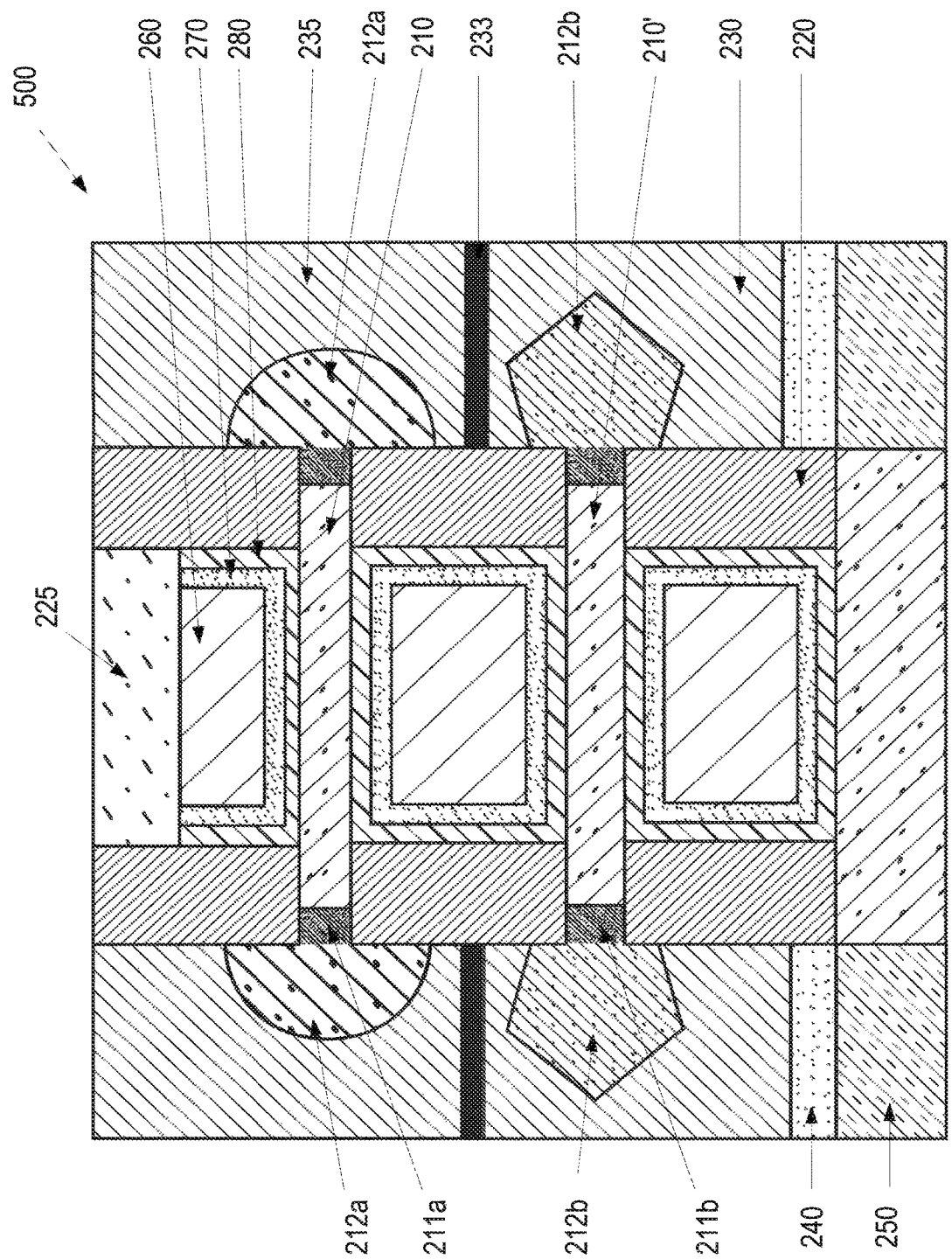
FIG. 5 is a cross-section view of a second semiconductor device according to certain aspects of the present disclosure.

FIG. 5 is a cross-section of a stacked nanowire complementary FET device having extension regions according to embodiments of the disclosure. The complementary device 500 includes an nanowire n-FET device as the upper device provided over a nanowire p-FET device as the lower device. As seen, device 500 includes a gate structure and S/D regions to form a complementary nanowire FET device. In the embodiment shown, the gate structure includes nanowires 210 and 210', metal fill 260, work function material (WFM) 270 and a high-k dielectric material 280 surrounding the nanowires 210, 210', as well as a gate cap 225 which covers these materials. Gate spacer 220 is also considered to form part of the gate structure, and is wrapped around opposing regions of the nanowires 210 and 210'. Etch stop layer (ESL) 240 and shallow trench isolation (STI) oxide coating 250 are also shown in the device 500.

The S/D regions of the device 500 include S/D contacts 212$a$ and 212$b$ formed on either side of the gate structure adjacent to the gate spacer 220. S/D contacts 212$a$ and 212$b$ are each surrounded by S/D metal forming the S/D electrodes 235 and 230 respectively in the S/D regions. The nFET wire 210 is coupled to upper S/D metal 235 (also referred as an upper metal electrode) and pFET wire 210' is coupled to lower S/D metal 230 (also referred as a lower metal electrode). The upper and lower metal are stacked overtop of one another and separated by dielectric 233 so that the nFET and pFET are independent devices. That is, in FIG. 5, the S/D contacts 212$a$ and 212$b$ are separated to provide separate contacts for each nanowire 210, 210', which can result in a smaller electrode contact area compared to the multi-channel device of FIG. 2.

Nanowire extension regions 211$a$, 211$b$ originate from within notches (or recesses) in the gate spacer 220 at ends of nanowire 210. Thus, in the embodiment of FIG. 5, the extension regions 211$a$ and 211$b$ connect the nanowires 210 and 210' to the S/D contacts 212$a$ and 212$b$ through respective openings in the gate spacer 220. The extension regions 211$a$ and 211$b$ can provide increased strain at the end of the nanowires 210, 210' to provide improved device performance which may compensate for the reduced electrode contact area. For example, the extension regions may be enriched and/or doped with doping materials to effect a strain on the nanowire channel region, as discussed above with respect to FIGS. 3 and 4A-4J. Enrichment and doping materials will generally depend on the conductivity type of the device.

In the above description, the order of discussion of the different steps as described herein has been presented for clarity sake. In general, these steps can be performed in any suitable order. Additionally, although each of the different features, techniques, configurations etc. herein may be discussed in different places of this disclosure, it is intended that each of the concepts can be executed independently of each other or in combination with each other. Accordingly, the present disclosure can be embodied and viewed in many different ways.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and, spirit of the present disclosures. For example, this technology may be structured for cloud computing whereby a single function is shared and processed in collaboration among a plurality of apparatuses via a network.

What is claimed is:

1. A method of forming a semiconductor device having a channel and a source-drain coupled to the channel, the method comprising:
    etching a channel region such that an end of the channel region forms a recess within a gate structure surrounding the channel region, wherein etching the channel region comprises executing a dry etch process, wherein said dry etch process includes at least one of atomic layer etch (ALE), quasi-ALE, selective vapor phase etch, and isotropic vapor phase etch;
    forming an extension region in contact with the channel region and at least partially filling said recess, wherein extension material of the extension region has a different composition from channel material of the channel region such that a strain is caused in the channel region, wherein the forming an extension region comprises epitaxial growth of the extension material from the channel region, wherein the forming an extension region comprises doping the extension material; and
    forming a source-drain region in contact with the extension region and adjacent to the gate structure.

2. The method according to claim 1, wherein the channel region comprises a nanowire and the gate structure comprises a gate spacer surrounding an end of the nanowire, said etching comprising selectively etching an end of the nanowire to form a recess within the gate spacer.

3. The method according to claim 2, wherein said selectively etching the nanowire comprises etching the nanowire to a depth less than a thickness of the gate spacer.

4. The method of claim 1, wherein said doping the extension material comprises in-situ doping during epitaxial growth of the extension material.

5. The method of claim 1, wherein said doping the extension material comprises annealing to diffuse dopants form the source-drain contacts into the extension region.

6. The method according to claim 1, wherein the forming an extension region comprises:
    epitaxial growth of the extension material such that the extension material includes additional extension material outside of said recess beyond a surface of the gate structure; and
    removing said additional extension material such that the extension doping material fills the recess and is substantially flush with the surface of the gate structure.

7. The method according to claim 1, wherein the forming an extension region comprises enriching the extension material.

8. The method of claim 7, wherein said forming a source drain region comprises epitaxial growth of source-drain material from the enriched extension doping material.

9. The method according to claim 5, wherein the annealing diffuses the dopants into the channel material.

10. A method of forming a semiconductor device having a channel and a source-drain coupled to the channel, the method comprising:
    etching a channel region such that an end of the channel region forms a recess within a gate structure surrounding the channel region;
    forming an extension region in contact with the channel region and at least partially filling said recess, wherein extension material of the extension region has a different composition from channel material of the channel region such that a strain is caused in the channel region, wherein the forming an extension region comprises epitaxial growth of the extension material from the channel region, wherein the forming an extension region comprises doping the extension material; and
    forming a source-drain region in contact with the extension region and adjacent to the gate structure.

11. The method of claim 10, wherein said doping the extension material comprises in-situ doping during epitaxial growth of the extension material.

12. The method of claim 10, wherein said doping the extension material comprises annealing to diffuse dopants form the source-drain contacts into the extension region.

13. The method according to claim 10, wherein the forming an extension region comprises:
    epitaxial growth of the extension material such that the extension material includes additional extension material outside of said recess beyond a surface of the gate structure; and
    removing said additional extension material such that the extension doping material fills the recess and is substantially flush with the surface of the gate structure.

14. The method according to claim 12, wherein the annealing diffuses the dopants into the channel material.

* * * * *